United States Patent [19]

Yu et al.

[11] Patent Number: 5,736,895

[45] Date of Patent: Apr. 7, 1998

[54] BIQUADRATIC SWITCHED-CAPACITOR FILTER USING SINGLE OPERATIONAL AMPLIFIER

[75] Inventors: Chu-Chiao Yu, Taipei; Shaw-Jia Hor, Taoyuan; Jean-Ming Lee, Hsinchu, all of Taiwan

[73] Assignee: Industrial Technology Research Institute, Hsinchu, Taiwan

[21] Appl. No.: 585,469

[22] Filed: Jan. 16, 1996

[51] Int. Cl.$^6$ ............................. H03K 5/00; H03M 3/00
[52] U.S. Cl. ..................... 327/554; 327/552; 327/337; 330/9; 333/173; 341/143
[58] Field of Search ................................... 327/552, 554, 327/561, 94, 337; 333/173; 330/9; 341/143, 172

[56] References Cited

U.S. PATENT DOCUMENTS

| | | | |
|---|---|---|---|
| 5,027,120 | 6/1991 | Thurston | 341/143 |
| 5,495,200 | 2/1996 | Kwan et al. | 327/553 |

*Primary Examiner*—Timothy P. Callahan
*Assistant Examiner*—Dinh T. Le
*Attorney, Agent, or Firm*—Cushman Darby & Cushman IP Group of Pillsbury Madison & Sutro LLP

[57] ABSTRACT

The present invention discloses a biquadratic switched-capacitor filter, which merely utilizes one operational amplifier to implement a biquadratic transfer function. The biquadratic switched-capacitor filter further comprises ten switched-capacitor circuits, two feedback capacitors, and two individual switching devices. The switching devices in this switched-capacitor filter can be controlled by six different clock signals. The first and second clock signals are two-phase, complementary but non-overlapping pulse trains with a reference period. The third clock signal is a pulse train with double the reference period and coincident with the first clock signal. The fourth, the fifth, and the sixth clock signals are pulse trains that result from delaying the third, the fourth, and the fifth clock signals by half the reference period. The obtained switched-capacitor filter can be used to simplify some applications, such as sigma-delta modulators.

20 Claims, 6 Drawing Sheets

5,736,895

BIQUADRATIC SWITCHED-CAPACITOR FILTER USING SINGLE OPERATIONAL AMPLIFIER

BACKGROUND OF THE INVENTION

1. Field of the Invention

The present invention relates in general to filters. More specifically, the present invention relates to a particular kind of filter structure known as a biquadratic switched-capacitor filter. A switched-capacitor filter can be used as a building block for constructing a sigma-delta modulator and the like, replacing more complicated implementing circuits.

2. Description of Related Art

Active RC filters are frequently used in modern integrated circuits as a replacement for traditional inductor-capacitor filters because they do not require inductors and are easy to implement. However, the resistor and capacitor values needed to construct many filters are much too large for fabrication. Large-value resistors occupy an excessive amount of integrated circuit (IC) chip area, have high parasitic capacitance, low tolerances, and large temperature sensitivity. A switched-capacitor circuit can simulate a large value resistor and can more easily be fabricated as part of an IC. Such circuits use a smaller amount of chip area. Furthermore, the equivalent resistance of a switched-capacitor circuit can be made even more precise than that of an actual resistor.

A switched-capacitor circuit generally has one capacitor and two/four switching devices. The switching devices can be, but are not limited to, MOS transistors that are controlled by two clock signals of different phases, complementary but non-overlapping pulse trains. Non-inverting switched-capacitor circuits, inverting switched-capacitor circuits, and shunt-capacitor circuits are popular as building blocks for filters.

FIG. 1 (Prior Art) is a circuit diagram of a known non-inverting switched-capacitor circuit. The switched-capacitor circuit comprises a capacitor 2, two switching devices 12, 14 that are controlled by a first clock signal $\phi_a$, and two switching devices 16, 18 controlled by a second clock signal $\phi_b$. Input signal Vi and output signal Vo are in phase and the simulated resistor value is inversely proportional to the clock frequency of the clock signals $\phi_a$ and $\phi_b$ and the capacitance of capacitor 2.

FIG. 2 (Prior Art) is a circuit diagram of another known inverting switched-capacitor circuit. The structure shown in FIG. 2 is similar to that in FIG. 1. The switched capacitor is denoted by reference numeral 4. The difference between them is that switching devices 22 and 28 are controlled by the clock signal $\phi_a$ and switching devices 24 and 26 are controlled by the clock signal $\phi_b$. Operation of this circuit results in an out-of-phase relationship between the input signal Vi and the output signal Vo.

FIG. 3 (Prior Art) is a circuit diagram of a shunt-capacitor circuit. One end of a capacitor 6 is grounded and the other end of the capacitor 6 is coupled to the switching device 32 controlled by the clock signal $\phi_a$ and to the switching device 34 controlled by the clock signal $\phi_b$. In practice, the non-inverting switched-capacitor circuit and the inverting switched-capacitor circuit are used to replace resistors that are not coupled to ground in an active RC filter and the shunt-capacitor circuit is used to replace grounding resistors.

The transfer function of a general biquadratic filter can be expressed as follows:

$$H(z) = -\frac{a_2 z^2 + a_1 z + a_0}{b_2 z^2 + b_1 z + 1} \quad (1)$$

wherein $a_0$, $a_1$, $a_2$, $b_2$, $b_1$ are coefficients of the biquadratic filter. According to the conventional principle of filters, an active RC filter with respect to Equation (1) should be readily obtained as shown in FIG. 4 (Prior Art). The whole filter comprises two operational amplifiers OP1 and OP2, three capacitors C1, C2, C5, and five resistors R1, R2, R3, R4, and R5. Values of these components, including C1, C2, C5, R1, R2, R3, R4, and R5, must be adjusted to meet the design objectives of the filter. It is possible to use switched-capacitor circuits to create a new configuration for a biquadratic switched-capacitor filter.

FIG. 5 (Prior Art) is a circuit diagram of a general-form biquadratic switched-capacitor filter. Compared with the structure shown in FIG. 4 (Prior Art), a Capacitor C1' together with four switching devices 41, 42, 43, 44 are assembled as a substitute for resistor R1, a capacitor C2' together with four switching devices 41, 42, 47, 48 as a substitute for resistor R2, a capacitor C3' together with four switching devices 45, 46, 47, 48 as a substitute for resistor R3, a capacitor C4' together with 43, 44, 49, 51 as a substitute for resistor R4, and a capacitor C5' together with 47, 48, 49, 51 as a substitute for resistor R5. As described above, the simulated resistor values can be determined by the operation frequency of the switching devices and the respective capacitor values.

As a practical matter, the minimum number of operational amplifiers required in a general biquadratic filter is two. However, any operational amplifier will occupy a large amount of chip area. Therefore, it is critical to eliminate waste of the chip area, especially when a large number of filters are required. On the other hand, as the number of the components increase, the power consumption will rise proportionally.

SUMMARY OF THE INVENTION

Under such circumstances described above, the first object of the present invention is to provide a biquadratic switched-capacitor filter having an arrangement that is simple enough to be implemented using only a single operational amplifier.

A second object of the present invention is to provide a biquadratic switched-capacitor filter, that can be used to construct a sigma-delta modulator having fewer operational amplifiers than required by prior art arrangements.

The present invention meets these objectives by providing a novel arrangement for a biquadratic switched-capacitor filter having a non-inverting input terminal, an inverting input terminal, a non-inverting output terminal, and an inverting output terminal. It utilizes a single operational amplifier having a non-inverting input, an inverting input, a non-inverting output, and an inverting output. The filter includes ten (10) switched capacitor circuits as follows.

First switched capacitor circuit

The first switched-capacitor circuit is controlled by a first clock signal and a second clock signal and is coupled between the inverting input terminal of the switched-capacitor filter and the inverting input end of the operational amplifier.

Second switched capacitor circuit

The second switched-capacitor circuit is controlled by the first clock signal and the second clock signal and is coupled between the inverting input terminal of the switched-capacitor filter and the inverting input end of the operational amplifier.

Third switched capacitor circuit

The third switched-capacitor circuit is controlled by the first clock signal and the second clock signal and is coupled between the non-inverting input terminal of the switched-capacitor filter and the non-inverting input end of the operational amplifier.

Fourth switched capacitor circuit

The fourth switched-capacitor circuit is controlled by the first clock signal and the second clock signal and is coupled between the non-inverting input terminal of the switched-capacitor filter and the non-inverting input end of the operational amplifier.

Fifth switched capacitor circuit

The fifth switched-capacitor circuit is controlled by the first clock signal and the second clock signal and is coupled between the inverting input end of the operational amplifier and the non-inverting output end of the operational amplifier.

Sixth switched capacitor circuit

The sixth switched-capacitor circuit is controlled by the first clock signal and the second clock signal and is coupled between the non-inverting input end of the operational amplifier and the inverting output end of the operational amplifier.

Seventh switched capacitor circuit

The seventh switched-capacitor circuit is controlled by a third clock signal and a fourth clock signal and is coupled between the inverting output end of the operational amplifier and the inverting input end of the operational amplifier.

Eighth switched capacitor circuit

The eighth switched-capacitor circuit is controlled by a fifth clock signal and a sixth clock signal and is coupled between the inverting output end of the operational amplifier and the inverting input end of the operational amplifier.

Ninth switched capacitor circuit

The ninth switched-capacitor circuit is controlled by the third clock signal and the fourth clock signal and is coupled between the non-inverting output end of the operational amplifier and the non-inverting input end of the operational amplifier.

Tenth switched capacitor circuit

The tenth switched-capacitor circuit is controlled by the fifth clock signal and the sixth clock signal and is coupled between the non-inverting output end of the operational amplifier and the non-inverting input end of the operational amplifier.

A first feedback capacitor is coupled between the non-inverting output end of the operational amplifier and the inverting input end of the operational amplifier. A second feedback capacitor is coupled between the inverting output end of the operational amplifier and the non-inverting input end of the operational amplifier. A first switching device, controlled by the second clock signal, is coupled between the non-inverting output end of the operational amplifier and the non-inverting output end of the switched-capacitor filter. A second switching device, controlled by the second clock signal, is coupled between the inverting output end of the operational amplifier and the inverting output terminal of the switched-capacitor filter. The clock signals are as follows:

First and second clock signals

The first clock signal and the second clock signal are two-phase, complementary but non-overlapping pulse trains with a reference period.

Third clock signal

The third clock signal is a pulse train with double the reference period and coincident with the first clock signal.

Fourth clock signal

The fourth clock signal is a pulse train that results from delaying the third clock signal by half the reference period.

Fifth clock signal

The fifth clock signal is a pulse train that results from delaying the fourth clock signal by half the reference period.

Sixth clock signal

The sixth clock signal is a pulse train that results from delaying the fifth clock signal by half the reference period.

The above-described biquadratic switched-capacitor filter can be used as a building block to construct a third-order sigma-delta modulator. The third-order sigma-delta modulator comprises means for receiving an input signal to the sigma-delta modulator;

means for providing an output signal of the sigma-delta modulator;

a first adder for adding the inverse of a feedback signal to the input signal, and generating a first signal;

a biquadratic switched-capacitor filter receiving the first signal from the first adder and generating a second signal;

a second adder for adding the inverse of the feedback signal to the second signal from the biquadratic switched-capacitor circuit, and generating a third signal;

a multiplier for multiplying the third signal by a number and generating a fourth signal;

a first-order filter for filtering the fourth signal and generating a fifth signal;

a quantizer for quantizing the fifth signal and generating the output signal of the third-order sigma-delta modulator; and a digital-to-analog converter for transforming the output signal, which is in digital form, into the feedback signal, which is in analog form.

BRIEF DESCRIPTION OF THE DRAWINGS

The detailed description of an embodiment of the present invention is made with reference to the accompanying drawings, wherein.

DETAILED DESCRIPTION OF THE PREFERRED EMBODIMENT

In the presently preferred embodiment of the present invention, one operational amplifier is used to form a biquadratic switched-capacitor filter. The preferred embodiment will be explained with reference to FIGS. 6a–6c which are circuit diagrams of the biquadratic switched-capacitor filter and with reference to FIG. 6d which is a timing diagram of the clock signals used to drive the biquadratic switched-capacitor filter.

The circuit is driven by six clock signals (see FIG 6d) which control the on/off state of all switching devices, respectively. Clock signal $\phi_1$ and clock signal $\phi_2$ are two-phase, complementary but non-overlapping pulse trains, similar to the conventional ones, with a reference period T. Clock signal $\phi_3$ is a pulse train with double the reference period (2T), and coincident with clock signal $\phi_1$. Clock signal $\phi_3$ results from expanding the period of clock signal $\phi_1$ to 2T with reference to a certain pulse of clock signal $\phi_1$. Clock signal $\phi_4$ can be considered as a pulse train that results from delaying clock signal $\phi_3$ by half the reference period, T/2. Similarly, clock signals $\phi_5$ and $\phi_6$ can also be considered as pulse trains that result from delaying clock signals $\phi_4$ and $\phi_5$, respectively, by half the reference period T/2. These clock signals can be easily generated by a known timing generator. We adopt the following convention to make description easier. All switching devices controlled by clock signal $\phi_1$ are denoted as $S1_i$ (i is an integer), similarly, the switching devices controlled by clock signals $\phi_2, \phi_3, \phi_4, \phi_5, \phi_6$ are individually denoted as $S2_i, S3_i, S4_i, S5_i, S6_i$.

Figure 1:
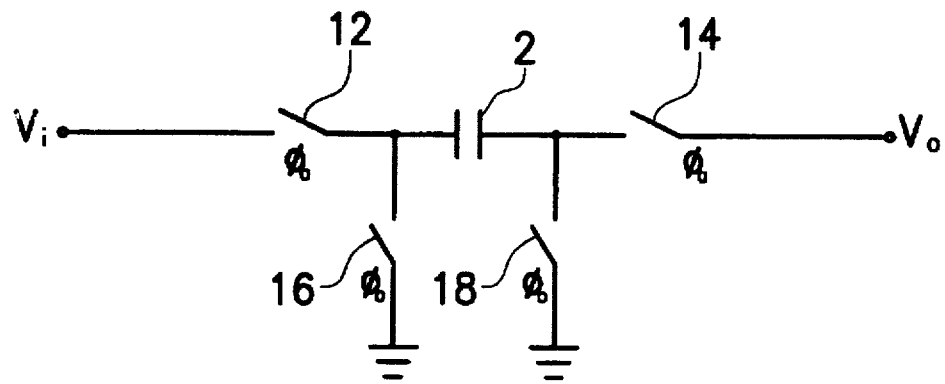
FIG. 1 (Prior Art) is a circuit diagram of the non-inverting switched-capacitor circuit.
Figure 2:
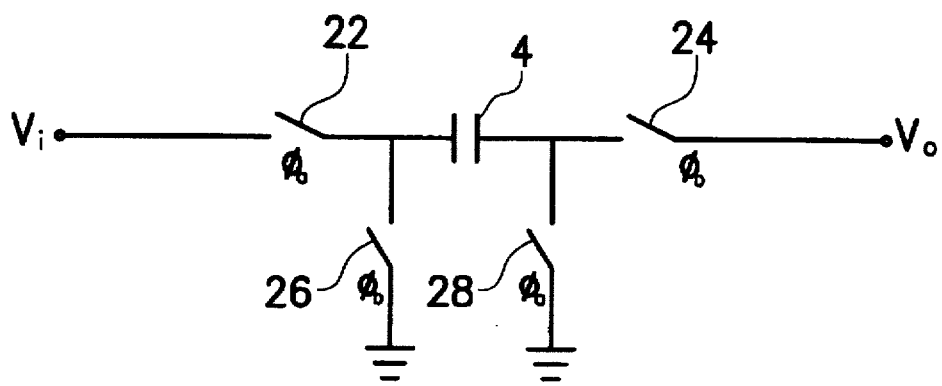
FIG. 2 (Prior Art) is a circuit diagram of the inverting switched-capacitor circuit.
Figure 3:
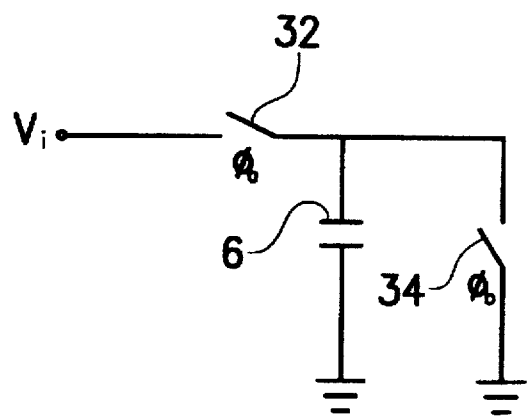
FIG. 3 (Prior Art) is a circuit diagram of the shunt-capacitor circuit.
Figure 4:
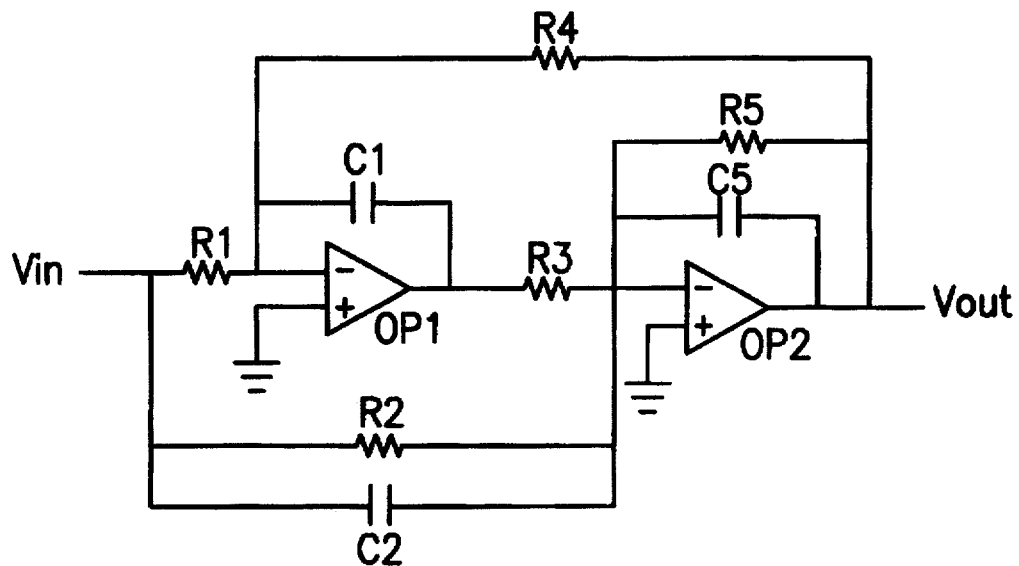
FIG. 4 (Prior Art) is a circuit diagram of the general-form biquadratic active RC filter.
Figure 5:
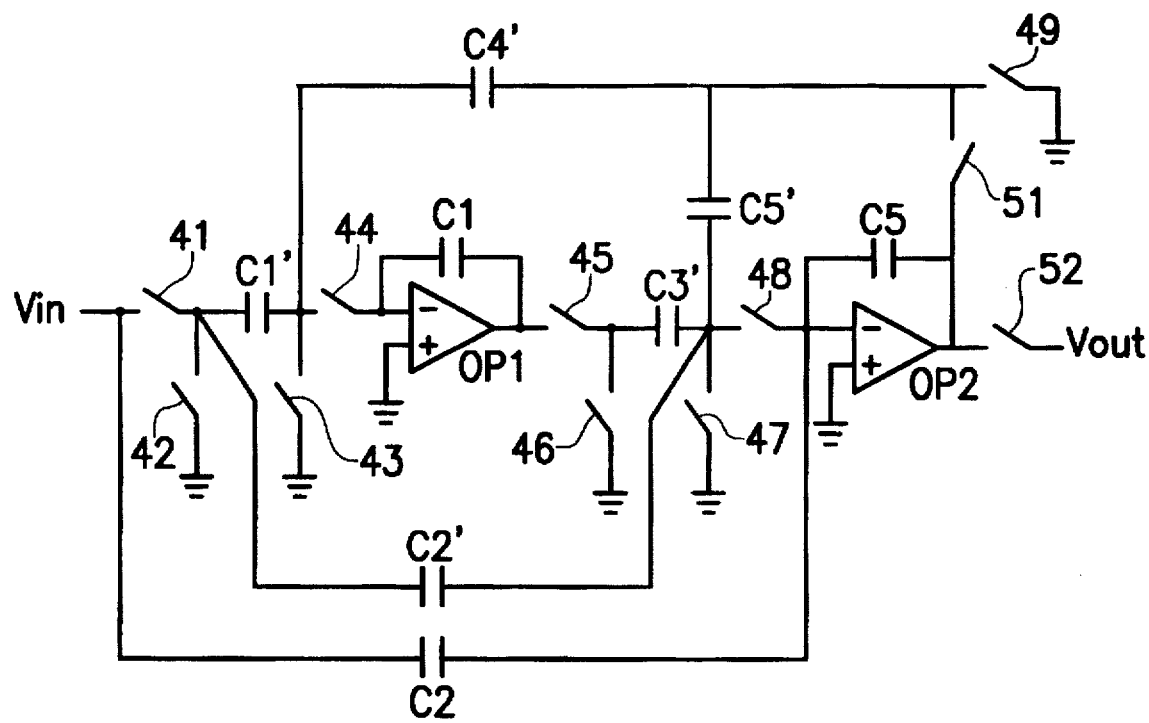
FIG. 5 (Prior Art) is a circuit diagram of the conventional general-form biquadratic switched-capacitor filter.
Figure 6A:
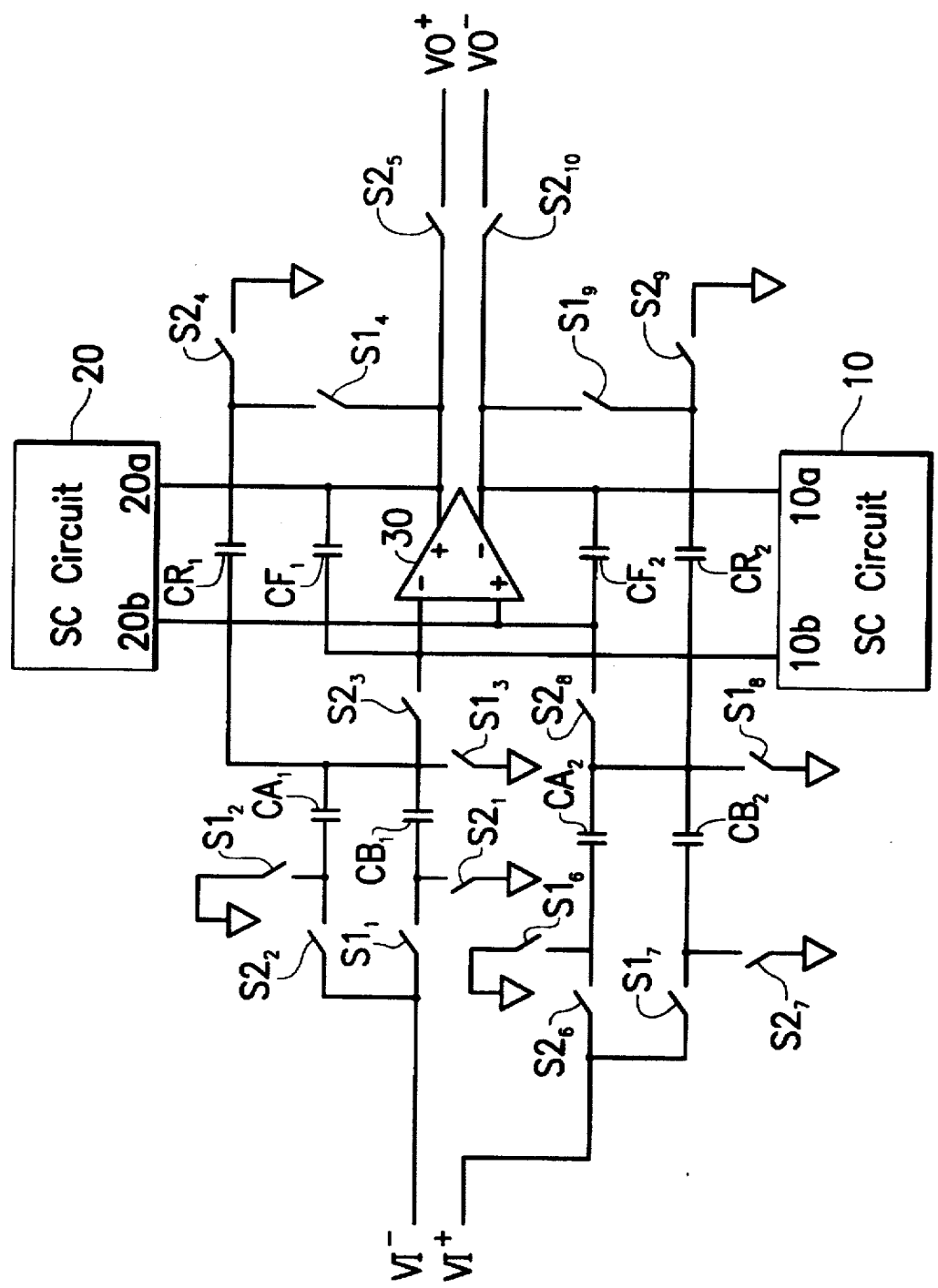
FIGS. 6a–6c are circuit diagrams of the biquadratic switched-capacitor filter in the embodiment of the present invention and FIG. 6d shows a timing diagram of the clock signals used for the biquadratic switched-capacitor filter of this embodiment.
Figure 6B:
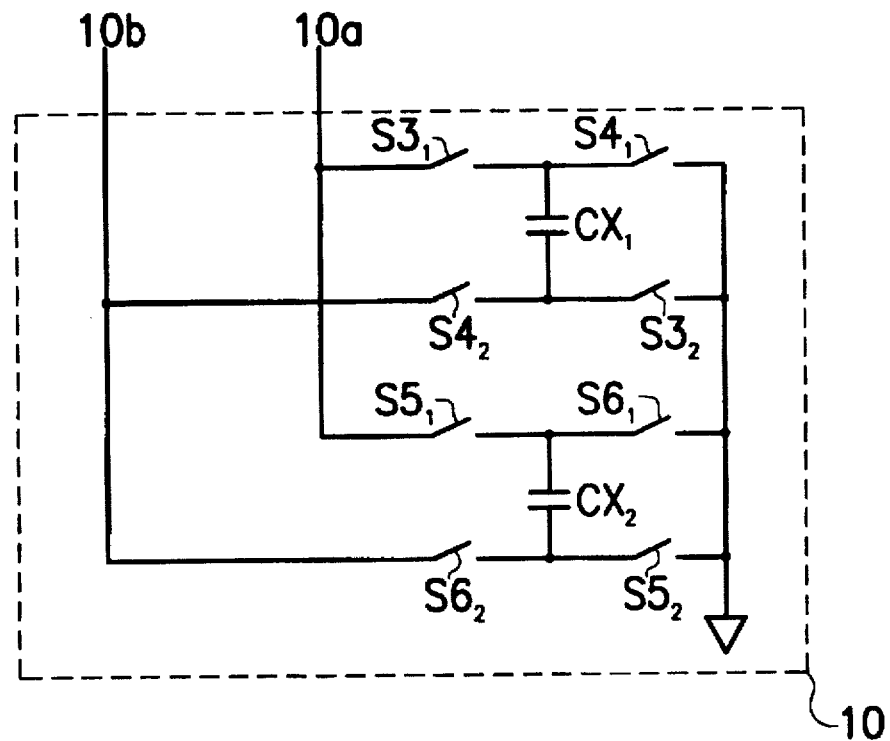
Figure 6C:
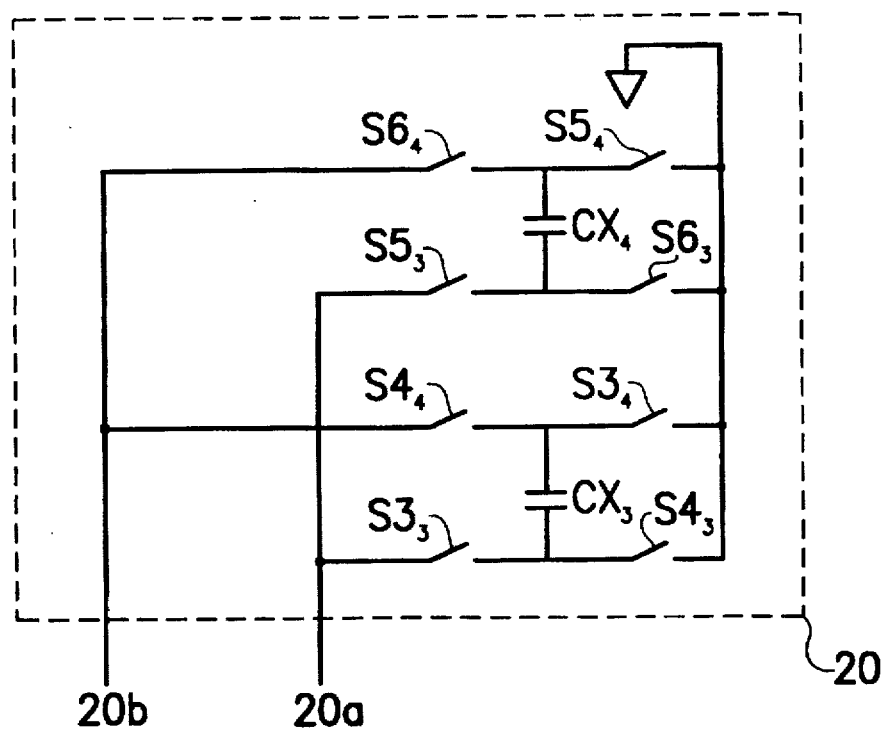
Figure 6D:
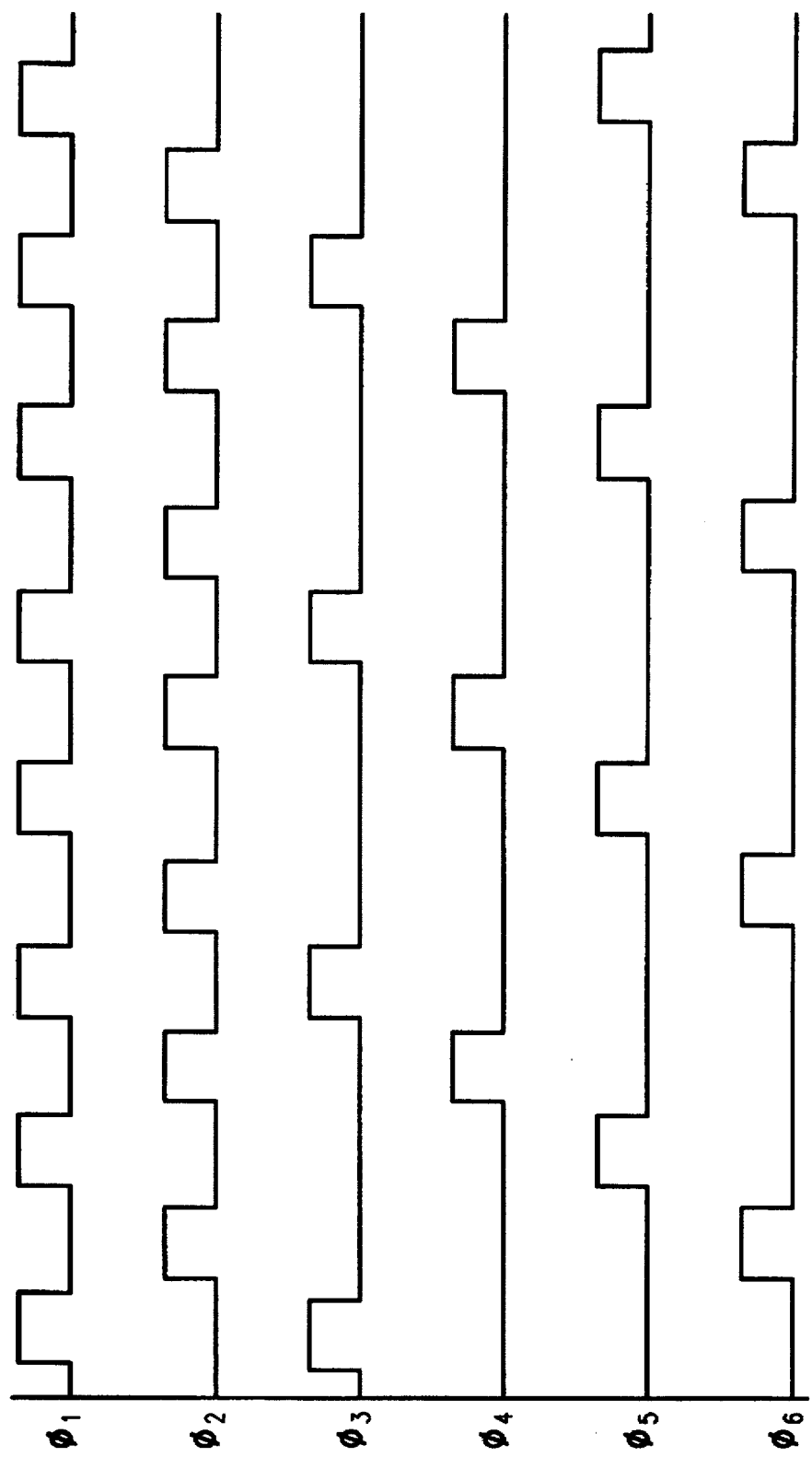

The detailed circuit topology in this embodiment is illustrated in FIG. 6a, 6b, and 6c. The switched-capacitor filter comprises ten switched-capacitor circuits, two feedback capacitors ($CF_1$ and $CF_2$), two individual switching devices ($S2_5$ and $S2_{10}$), as well as only one operational amplifier 30. Because most of the switching devices in this circuit are shared by at least two switched-capacitor circuits, it is difficult to discriminate these ten switched-capacitor circuits so as to omit their notations in the figures. Here we will describe the compositions of these ten switched-capacitor circuits. In FIG. 6a, a capacitor $CA_1$ and four switching devices $S1_2, S1_3, S2_2, S2_3$ constitute a first switched-capacitor circuit of non-inverting type. A capacitor $CB_1$ and four switching devices $S2_1, S1_3, S2_3, S1_1$ constitute a second switched-capacitor circuit of inverting type. A capacitor $CA_2$ and four switching devices $S1_6, S1_8, S2_6, S2_8$ constitute a third switched-capacitor circuit of non-inverting type. A capacitor $CB_2$ and four switching devices $S2_7, S1_8, S1_7, S2_8$ constitute a fourth switched-capacitor circuit of inverting type. A capacitor $CR_1$ and four switching devices $S1_3, S2_4, S2_3, S1_4$ constitute a fifth switched-capacitor circuit of inverting type. A capacitor $CR_2$ and four switching devices $S1_8, S2_9, S2_8, S1_9$ constitute a sixth switched-capacitor circuit of inverting type. In FIG. 6b, a capacitor $CX_1$ and four switching devices $S4_1, S3_2, S3_1, S4_2$ constitute a seventh switched-capacitor circuit of inverting type. A capacitor $CX_2$ and four switching devices $S6_1, S5_2, S5_1, S6_2$ constitute an eighth switched-capacitor circuit of inverting type. In FIG. 6c, a capacitor $CX_3$ and four switching devices $S3_4, S4_3, S3_3, S4_4$ constitute a ninth switched-capacitor circuit of inverting type. A capacitor $CX_4$ and four switching devices $S5_4, S6_3, S5_3, S6_4$ constitute a tenth switched-capacitor circuit of inverting type. In each of switched-capacitor circuits, the first two switching devices (such as $S1_2, S1_3$ in the first switched-capacitor circuit) ground and the last two switching devices (such as $S2_2, S2_3$ in the first switched-capacitor circuit) serve as input/output ports. In practice, the first switched-capacitor circuit and the third switched-capacitor circuit can also be the inverting type, meanwhile, the second switched-capacitor circuit and the fourth switched-capacitor circuit can also be the non-inverting type. Such an exchange does not affect the structure of this switched-capacitor filter.

The switched-capacitor filter has an inverting input terminal VI⁻, a non-inverting input terminal VI⁺, a non-inverting output terminal VO⁺, and an inverting output terminal VO⁻. The operational amplifier 30 also has inverting input/outputs and non-inverting input/outputs. The first switched-capacitor circuit and the second switched-capacitor circuit are both coupled between the inverting input terminal VI⁻ and the inverting input end of the operational amplifier 30. The third switched-capacitor circuit and the fourth switched-capacitor circuit are both coupled between the non-inverting input terminal VI⁺ and the non-inverting input end of operational amplifier 30. Then the fifth switched-capacitor circuit and feedback capacitor $CF_1$ which serve as feedback path, are coupled between non-inverting output end and the inverting input end of the operational amplifier 30. The sixth switched-capacitor circuit and the feedback capacitor $CF_2$ are coupled between inverting output and non-inverting input of the operational amplifier 30. The individual switching devices $S2_5$ and $S2_{10}$, which control the output path, are coupled between the non-inverting output end and the non-inverting output terminal VO⁺ and the inverting output/inverting output terminal VO⁻, respectively. Block 10, which comprises the seventh switched-capacitor circuit and the eighth switched-capacitor circuit, is coupled between the non-inverting output/inputs of the operational amplifier 30 by points 10a and 10b. Block 20, which comprises the ninth switched-capacitor circuit and the tenth switched-capacitor circuit, is coupled between the inverting output/inputs of the operational amplifier 20 by points 20a and 20b.

The transfer function of the biquadratic switched-capacitor filter shown in FIG. 6 can be expressed as:

$$H(z) = \frac{VO^+ = VO^-}{VI^+ - VI^-} = \frac{CA/CF = (CB/CF)z^{-1}}{1 - (1 + CR/CF)z^{-1} + (CX/CF)z^{-2}} \quad (2)$$

wherein CA is the capacitance of the capacitors $CA_1$ and $CA_2$; CF is the capacitance of the feedback capacitors $CF_1$ and $CF_2$; CB is the capacitance of the capacitors $CB_1$ and $CB_2$; CR is the capacitance of the capacitors $CR_1$ and $CR_2$; CX is the capacitance of the capacitors $CX_1, CX_2, CX_3, CX_4$. According to Equation (2), we can recognize that the term $z^{-2}$ should result from the effect of blocks 10 and 20.

Compared with Equation (1), the switched-capacitor filter functioning as Equation (2) does not comply with the general-form biquadratic filter. The $z^{-1}$ term of the numerator in Equation (2) is missing and then the absolute value of the coefficient of the $z^{-1}$ term of the denominator must be greater than 1. However, a plurality of practical filter application can be implemented in the form of Equation (2), such as sigma-delta modulators. The following describes a sigma-delta modulator of simplified form including the biquadratic switched-capacitor filter of the present invention.

Figure 7:
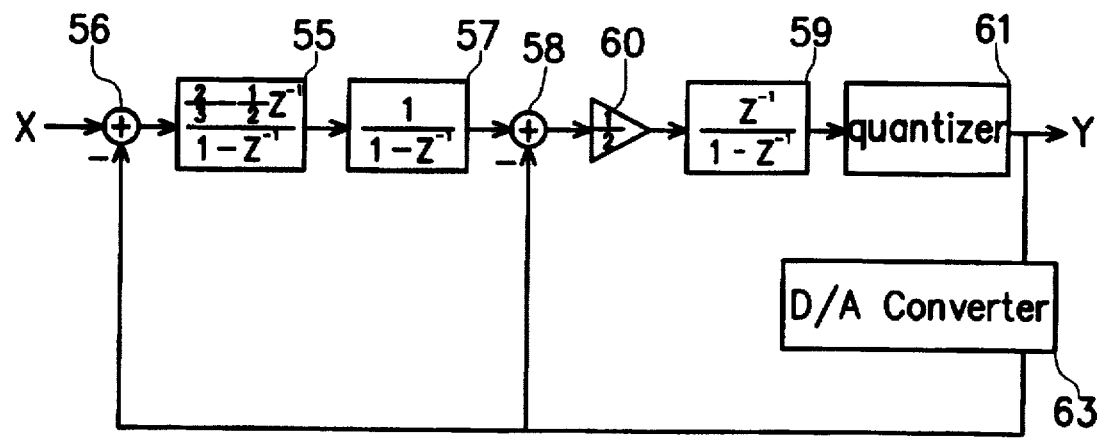
FIG. 7 (Prior Art) is a block diagram of an example of the third-order sigma-delta modulator.

FIG. 7 (Prior Art) is a block diagram of an example of the third-order sigma-delta modulator, wherein reference numerals 55 and 57 indicate two first-order filters with transfer functions of $$\frac{\frac{2}{3} - \frac{1}{2}z^{-1}}{1-z^{-1}} \text{ and } \frac{1}{1-z^{-1}}.$$

Figure 8:
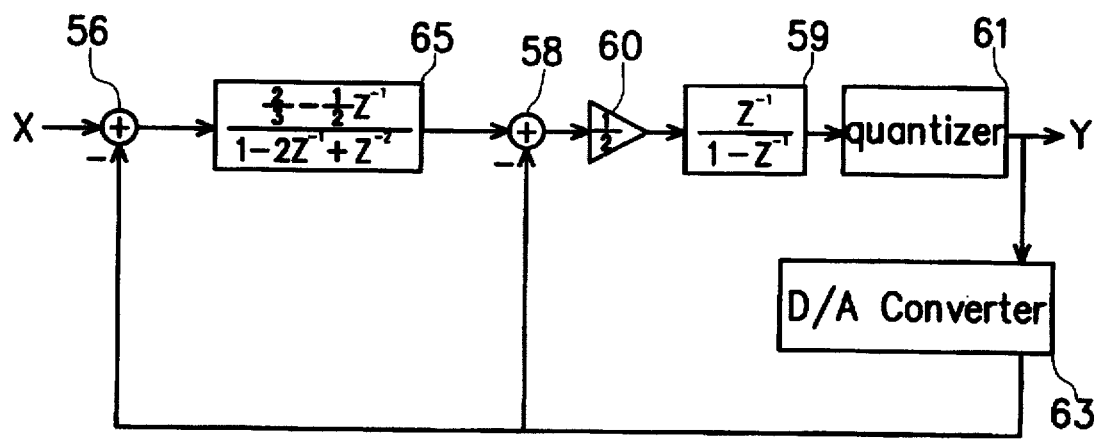
FIG. 8 is a block diagram of the reconfigured third-order sigma-delta modulator using the biquadratic switched-capacitor filter of this embodiment.

These two transfer functions can be combined into the transfer function of $$\frac{\frac{2}{3} - \frac{1}{2}z^{-1}}{1 - 2z^{-1} + z^{-2}},$$

which complies with Equation (2) The block diagram of the reconfigured third-order sigma-delta modulator using the biquadratic switched-capacitor filter of this embodiment is shown in FIG. 8. Input signal X is fed into first adder 56, added with inverse of a feedback signal sending from digital-to-analog converter 63. A first reference signal generated from first adder 56 is fed into the biquadratic switched-capacitor filter 65, just as with the above-mentioned structure. Biquadratic filter 65 generates a second reference signal and feeds into second adder 58. Identical to first adder 56, second adder 58 sums up the second reference signal and inverse of the feedback signal and generates a third reference signal. Multiplier 60 multiplies the third reference signal by a number (determined by characteristic of the sigma-delta modulator) and generates a fourth reference signal. First-order filter 59, with a transfer function of $$\frac{z^{-1}}{1-z^{-1}}$$

in this case, can receive the fourth reference signal and generate a fifth reference signal after filtering. Quantizer 61, used to transform a digital signal into an analog signal, receives the fifth reference signal and generates the output signal Y of the third-order sigma-delta modulator. Finally, digital-to-analog converter 63 is used to convert the digital output signal Y into the analog feedback signal. The number of operational amplifiers required in the third-order sigma-delta modulator thus as reduced from three to two.

The advantages of the present invention are described as follows:

1. The biquadratic switched-capacitor filter disclosed in this embodiment only includes a single operational amplifier. Such a filter can be applied in integrated circuits to save a large amount of chip area, especially for applications requiring a large number of filters.
2. The biquadratic switched-capacitor filter can be used in some circuits, such as sigma-delta modulators, to simplify their structures.

What is claimed is:

1. A biquadratic switched-capacitor filter having a non-inverting input terminal, an inverting input terminal, a non-inverting output terminal, and an inverting output, terminal, the biquadratic switched-capacitor filter comprising:

an operational amplifier having a non-inverting input, an inverting input, a non-inverting output, and an inverting output;

a first switched-capacitor circuit, controlled by a first clock signal and a second clock signal, coupled between the inverting input terminal of the biquadratic switched-capacitor filter and the inverting input of the operational amplifier;

a second switched-capacitor circuit, controlled by the first clock signal and the second clock signal, coupled between the inverting input terminal of the biquadratic switched-capacitor filter and the inverting input of the operational amplifier;

a third switched-capacitor circuit, controlled by the first clock signal and the second clock signal, coupled between the non-inverting input terminal of the biquadratic switched-capacitor filter and the non-inverting input of the operational amplifier;

a fourth switched-capacitor circuit, controlled by the first clock signal and the second clock signal, coupled between the non-inverting input terminal of the biquadratic switched-capacitor filter and the non-inverting input of the operational amplifier;

a fifth switched-capacitor circuit, controlled by the first clock signal and the second clock signal, coupled between the inverting input of the operational amplifier and the non-inverting output of the operational amplifier;

a sixth switched capacitor circuit, controlled by the first clock signal and the second clock signal, coupled between the non-inverting input of the operational amplifier and the inverting output of the operational amplifier;

a seventh switched-capacitor circuit, controlled by a third clock signal and a fourth clock signal, coupled between the inverting output of the operational amplifier and the inverting input of the operational amplifier;

an eighth switched-capacitor circuit, controlled by a fifth clock signal and a sixth clock signal, coupled between the inverting output of the operational amplifier and the inverting input of the operational amplifier;

a ninth switched-capacitor circuit, controlled by the third clock signal and the fourth clock signal, coupled between the non-inverting output of the operational amplifier and the non-inverting input of the operational amplifier;

a tenth switched-capacitor circuit, controlled by the fifth clock signal and the sixth clock signal, coupled between the non-inverting output of the operational amplifier and the non-inverting input of the operational amplifier;

a first feedback capacitor, coupled between the non-inverting output of the operational amplifier and the inverting input of the operational amplifier;

a second feedback capacitor, coupled between the inverting output of the operational amplifier and the non-inverting input of the operational amplifier;

a first switching device, controlled by the second clock signal, coupled between the non-inverting output of the operational amplifier and the non-inverting output terminal of the biquadratic switched-capacitor filter; and a second switching device, controlled by the second clock signal, coupled between the inverting output of the operational amplifier and the inverting output terminal of the biquadratic switched-capacitor filter;

wherein the first clock signal and the second clock signal are two-phase, complementary but non-overlapping pulse trains with a reference period, the third clock signal is a pulse train with double the reference period and coincident with the first clock signal, the fourth clock signal is a pulse train that results from delaying the third clock signal by half the reference period, the fifth clock signal is a pulse train that results from delaying the fourth clock signal by half the reference period, and the sixth clock signal is a pulse train that results from delaying the fifth clock signal by half the reference period.

2. The biquadratic switched-capacitor filter of claim 1, wherein the first switched-capacitor circuit and the third switched-capacitor circuit are inverting switched-capacitor circuits, and the second switched-capacitor circuit and the fourth switched-capacitor circuit are non-inverting switched-capacitor circuits.

3. The biquadratic switched-capacitor filter of claim 1, wherein the first switched-capacitor circuit and the third switched-capacitor circuit are non-inverting switched-capacitor circuits, and the second switched-capacitor circuit and the fourth switched-capacitor circuit are inverting switched-capacitor circuits.

4. The biquadratic switched-capacitor filter of claim 1, wherein the fifth switched-capacitor circuit, the sixth switched-capacitor circuit, the seventh switched-capacitor circuit, the eighth switched-capacitor circuit, the ninth switched-capacitor circuit, and the tenth switched-capacitor circuit are inverting switched-capacitor circuits.

5. The biquadratic switched-capacitor filter of claim 4, wherein the first-switched-capacitor circuit and the third switched-capacitor circuit are inverting switched-capacitor circuits, and the second switched-capacitor circuit and the fourth switched-capacitor circuit are non-inverting switched-capacitor circuits.

6. The biquadratic switched-capacitor filter of claim 4, wherein the first switched-capacitor circuit and the third switched-capacitor circuit are non-inverting switched-capacitor circuits, and the second switched-capacitor circuit and the fourth switched-capacitor circuit are inverting switched-capacitor circuits.

7. The biquadratic switched-capacitor filter of claim 6, wherein the transfer function of the biquadratic switched-capacitor filter can be expressed as:

$$H(z) = \frac{+(CA/CF) - (CB/CF)z^{-1}}{1 - (1 + CR/CF)z^{-1} + (CX/CF)z^{-2}}$$

wherein CA is the capacitance of capacitors that reside in the first switched-capacitor circuit and in the third switched-capacitor circuit;

CF is the capacitance of the first feedback capacitor and the second feedback capacitor;

CB is the capacitance of capacitors that reside in the second switched-capacitor circuit and in the fourth switched-capacitor circuit;

CR is the capacitance of capacitors that reside in the fifth switched-capacitor circuit and in the sixth switched-capacitor circuit;

CX is the capacitance of capacitors that reside in the seventh switched-capacitor circuit, the eighth switched-capacitor circuit, the ninth switched-capacitor circuit, and the tenth switched-capacitor circuit.

8. The biquadratic switched-capacitor filter of claim 1, wherein the first switching device is a MOS transistor.

9. The biquadratic switched-capacitor filter of claim 1, wherein the second switching device is a MOS transistor.

10. The biquadratic switched-capacitor filter of claim 8, wherein the second switching device is a transistor.

11. A third-order sigma-delta modulator, comprising:

means for receiving an input signal to the sigma-delta modulator;

means for providing an output signal of the sigma-delta modulator;

a D/A converter for transforming the output signal from digital form into a feedback signal of analog form;

a first adder for adding the inverse of the feedback signal to the input signal, and generating a first signal indicative thereof;

a biquadratic switched-capacitor filter having an input for receiving the first signal and providing a second signal as its output, the biquadratic switched-capacitor filter comprising:

an operational amplifier having a non-inverting input, an inverting input, a non-inverting output, and an inverting output;

a first switched-capacitor circuit, which is controlled by a first clock signal and a second clock signal and coupled between the inverting input terminal of the biquadratic switched-capacitor filter and the inverting input of the operational amplifier;

a second switched-capacitor circuit, which is controlled by the first clock signal and the second clock signal and coupled between the inverting input terminal of the biquadratic switched-capacitor filter and the inverting input of the operational amplifier;

a third switched-capacitor circuit, which is controlled by the first clock signal and the second clock signal and coupled between the non-inverting input terminal of the biquadratic switched-capacitor filter and the non-inverting input of the operational amplifier;

a fourth switched-capacitor circuit, which is controlled by the first clock signal and the second clock signal and coupled between the non-inverting input terminal of the biquadratic switched-capacitor filter and the non-inverting input of the operational amplifier;

a fifth switched-capacitor circuit, which is controlled by the first clock signal and the second clock signal and coupled between the inverting input of the operational amplifier and the non-inverting output of the operational amplifier;

a sixth switched-capacitor circuit, which is controlled by the first clock signal and the second clock signal and coupled between the non-inverting input of the operational amplifier and the inverting output of the operational amplifier;

a seventh switched-capacitor circuit, which is controlled by a third clock signal and a fourth clock signal and coupled between the inverting output of the operational amplifier and the inverting input of the operational amplifier;

an eighth switched-capacitor circuit, which is controlled by a fifth clock signal and a sixth clock signal and coupled between the inverting output of the operational amplifier and the inverting input of the operational amplifier;

a ninth switched-capacitor circuit, which is controlled by the third clock signal and the fourth clock signal and coupled between the non-inverting output of the operational amplifier and the non-inverting input of the operational amplifier;

a tenth switched-capacitor circuit, which is controlled by the fifth clock signal and the sixth clock signal and coupled between the non-inverting output of the operational amplifier and the non-inverting input of the operational amplifier;

a first feedback capacitor, which is coupled between the non-inverting output of the operational amplifier and the inverting input of the operational amplifier;

a second feedback capacitor, which is coupled between the inverting output of the operational amplifier and the non-inverting input of the operational amplifier;

a first switching device, which is controlled by the second clock signal and coupled between the non-inverting output of the operational amplifier and the non-inverting output terminal of the biquadratic switched-capacitor filter; and a second switching device, which is controlled by the second clock signal and coupled between the inverting output of the operational amplifier and the inverting output terminal of the biquadratic switched-capacitor filter;

wherein the first clock signal and the second clock signal are two-phase, complementary but non-overlapping pulse trains with a reference period, the third clock signal is a pulse train with double the reference period and coincident with the first clock signal, the fourth clock signal is a pulse train that results from delaying the third clock signal by half the reference period, the fifth clock signal is a pulse train that results from delaying the fourth clock signal by half the reference period, and the sixth clock signal is a pulse train that results from delaying the fifth clock signal by half the reference period;

a second adder for adding the inverse of the feedback signal to the second output from the biquadratic switched-capacitor circuit, and generating a third signal indicative thereof;

a multiplier for multiplying the third signal by a number and generating a fourth signal indicative thereof;

a first order filter for filtering the fourth reference signal and generating a fifth signal indicative thereof; and a quantizer for quantizing the fifth signal and generating the output signal of the third-order sigma-delta modulator.

12. The sigma-delta modulator of claim 11 wherein in the switched-capacitor filter the first switched-capacitor circuit and the third switched-capacitor circuit are-inverting switched-capacitor circuits, and the second switched-capacitor circuit and the fourth switched-capacitor circuit are non-inverting switched-capacitor circuits.

13. The sigma-delta modulator of claim 11 wherein in the switched-capacitor filter the first switched-capacitor circuit and the third switched-capacitor circuit are non-inverting switched-capacitor circuits, and the second switched-capacitor circuit and the fourth switched-capacitor circuit are inverting switched-capacitor circuits.

14. The sigma-delta modulator of claim 11 wherein in the switched-capacitor filter the fifth switched-capacitor circuit, the sixth switched-capacitor circuit, the seventh switched-capacitor circuit, the eighth switched-capacitor circuit, the ninth switched-capacitor circuit, and the tenth switched-capacitor circuit are inverting switched-capacitor circuits.

15. The sigma-delta modulator of claim 14 wherein in the switched-capacitor filter the first switched-capacitor circuit and the third switched-capacitor are inverting switched-capacitor circuits, and the second switched-capacitor circuit and the fourth switched-capacitor circuit are non-inverting switched-capacitor circuits.

16. The sigma-delta modulator of claim 14 wherein in the switched-capacitor filter the first switched-capacitor circuit and the third switched-capacitor circuit are non-inverting switched-capacitor circuits, and the second switched-capacitor circuit and the fourth switched-capacitor circuit are inverting switched-capacitor circuits.

17. The sigma-delta modulator of claim 16 wherein in the switched-capacitor filter the transfer function of the biquadratic switched-capacitor filter can be expressed as:

$$H(z) = \frac{+(CA/CF) - (CB/CF)z^{-1}}{1 - (1 + CR/CF)z^{-1} + (CX/CF)z^{-2}}$$

wherein CA is the capacitance of capacitors that reside in the first switched-capacitor circuit and in the third switched-capacitor circuit;

CF is the capacitance of the first feedback capacitor and the second feedback capacitor;

CB is the capacitance of capacitors that reside in the second switched-capacitor circuit and in the fourth switched-capacitor circuit;

CR is the capacitance of capacitors that reside in the fifth switched-capacitor circuit and in the sixth switched-capacitor circuit;

CX is the capacitance of capacitors that reside in the seventh switched-capacitor circuit, the eighth switched-capacitor circuit, the ninth switched-capacitor circuit and, the tenth switched-capacitor circuitry and, the tenth switched-capacitor circuit.

18. The sigma-delta modulator of claim 11 wherein in the switched-capacitor filter the first switching device is a MOS transistor.

19. The sigma-delta modulator of claim 11 wherein in the switched-capacitor filter the second switching device is a MOS transistor.

20. The sigma-delta modulator of claim 18 wherein in the switched-capacitor filter the second switching device is a MOS transistor.

* * * * *